United States Patent [19]

Wells

[11] Patent Number: 4,914,405
[45] Date of Patent: Apr. 3, 1990

[54] FREQUENCY SYNTHESIZER

[75] Inventor: John N. Wells, St Albans, United Kingdom

[73] Assignee: Marconi Instruments Limited, St. Albans, United Kingdom

[21] Appl. No.: 239,567

[22] Filed: Sep. 1, 1988

[30] Foreign Application Priority Data

Sep. 4, 1987 [GB] United Kingdom ............ 8720794

[51] Int. Cl.[4] ............................................. H03L 7/00
[52] U.S. Cl. ......................................... 331/25; 331/19
[58] Field of Search ............... 331/10, 11, 16, 18, 331/19, 25; 455/260; 307/529

[56] References Cited

U.S. PATENT DOCUMENTS 4,584,539 4/1986 Stankey ............................ 331/16

FOREIGN PATENT DOCUMENTS 1589046 5/1981 United Kingdom .
2092844 8/1982 United Kingdom .
2128048 4/1984 United Kingdom .
2179512 3/1987 United Kingdom .

Primary Examiner—Eugene R. LaRoche
Assistant Examiner—Robert J. Pascal
Attorney, Agent, or Firm—Spencer & Frank

[57] ABSTRACT

A low-noise frequency synthesizer comprises a low-noise oscillator, such as a crystal oscillator, a multiplier, a divider and a phase-locked loop and is adapted to provide an output signal which is a combination of the multiplied and divided frequency. Thus, a large number of frequencies are available as an output in small increments determined by the division ratio of the divider.

8 Claims, 3 Drawing Sheets

FREQUENCY SYNTHESIZER

FIELD OF THE INVENTION

This invention relates to a frequency synthesizer and in particular it relates to a low-noise frequency synthesizer.

Low-noise frequency synthesizers generally use as a reference frequency one or more low-noise oscillators, either crystal oscillators or perhaps surface acoustic wave (SAW) devices. It is of course desirable to have available as many different frequencies as possible without the need for a separate crystal or SAW for every frequency that is required. In addition, the low-noise properties must be retained.

One traditional approach is to use a harmonic multiplier system in which the frequency of a crystal oscillator is multiplied by an integer. A step-recovery diode is often used to generate a spectrum of harmonics from the oscillator, and a band pass filter or a phase locked loop (PLL) used to extract one specific harmonic. A carefully designed crystal oscillator can have a noise floor of greater than −170 dBc/Hz for offset frequencies of a few kilohertz or more. However, any subsequent multiplication of this frequency will increase the noise power by an amount equal to the square of the multiplication factor. Thus an oscillator running at say 10 MHz would yield a noise floor of −130 dBc after multiplication to 1 GHz. The noise floor can be improved by starting with a crystal oscillator at a higher frequency and indeed the −170 dBc floor still holds good for such oscillators running at 100 MHz. In such a case the noise floor is increased to −150 dBc after multiplication to 1 GHz. However the drawback with such a system is that frequencies are now only available in 100 MHz increments, thus reducing the flexibility of such a system.

SUMMARY OF THE INVENTION

According to the present invention there is provided a frequency synthesizer comprising an oscillator arranged to generate a signal at a first frequency; means for multiplying this first frequency by an integer value; means for dividing the first frequency by an integer value and a phase locked loop for combining the outputs from the multiplying means and the dividing means to obtain an output which is a combination of the multiplied and the divided frequency.

Thus a relatively high reference frequency can be used with the present invention and frequencies are available of increments less than the reference or oscillator frequency. The oscillator should be of low noise type and may in preferred embodiments be a crystal oscillator or perhaps a SAW device.

Thr phase-locked loop may comprise a phase detector, a voltage controlled oscillator and a mixer and be arranged such that the voltage controlled oscillator is steered to a frequency that is substantially equal to the multiplier frequency plus or minus the divider frequency.

In a second aspect the invention provides a frequency synthesizer comprising an oscillator arranged to generate a signal at a first frequency, a multiplier arranged to multiply the first frequency by integral values; a divider arranged to divide the first frequency by 2, 3 or 6; and a phase-locked loop adapted to combine the outputs of the multiplier and divider to produce an output signal which is a combination of the multiplied and the divided frequency.

In embodiments according to the second aspect of the invention the multiplier is arranged to provide an output at NFo, (N+1) Fo, (N+2) Fo, etc. where Fo is the frequency generated by the oscillator and N is an integer. The divider is arranged to produce wither Fo/2, Fo/3, or Fo/6. The phase-locked loop then combines these two frequencies. Thus, as is shown below, by varying N a large number of frequencies are available as an output in increments of Fo/6.

Preferably the multiplier may comprise; an input for the signal at the first frequency, and a series chain of doublers, or multipliers of some other integer value. The multiplier also includes switches such that an output can be taken from a selected combination of one or all of the doubler outputs. It may also take an output from a DC source.

Embodiments of the invention will now be described by way of example only with reference to the accompanying drawings.

DETAILED DESCRIPTION OF EMBODIMENTS OF THE INVENTION

Figure 1:
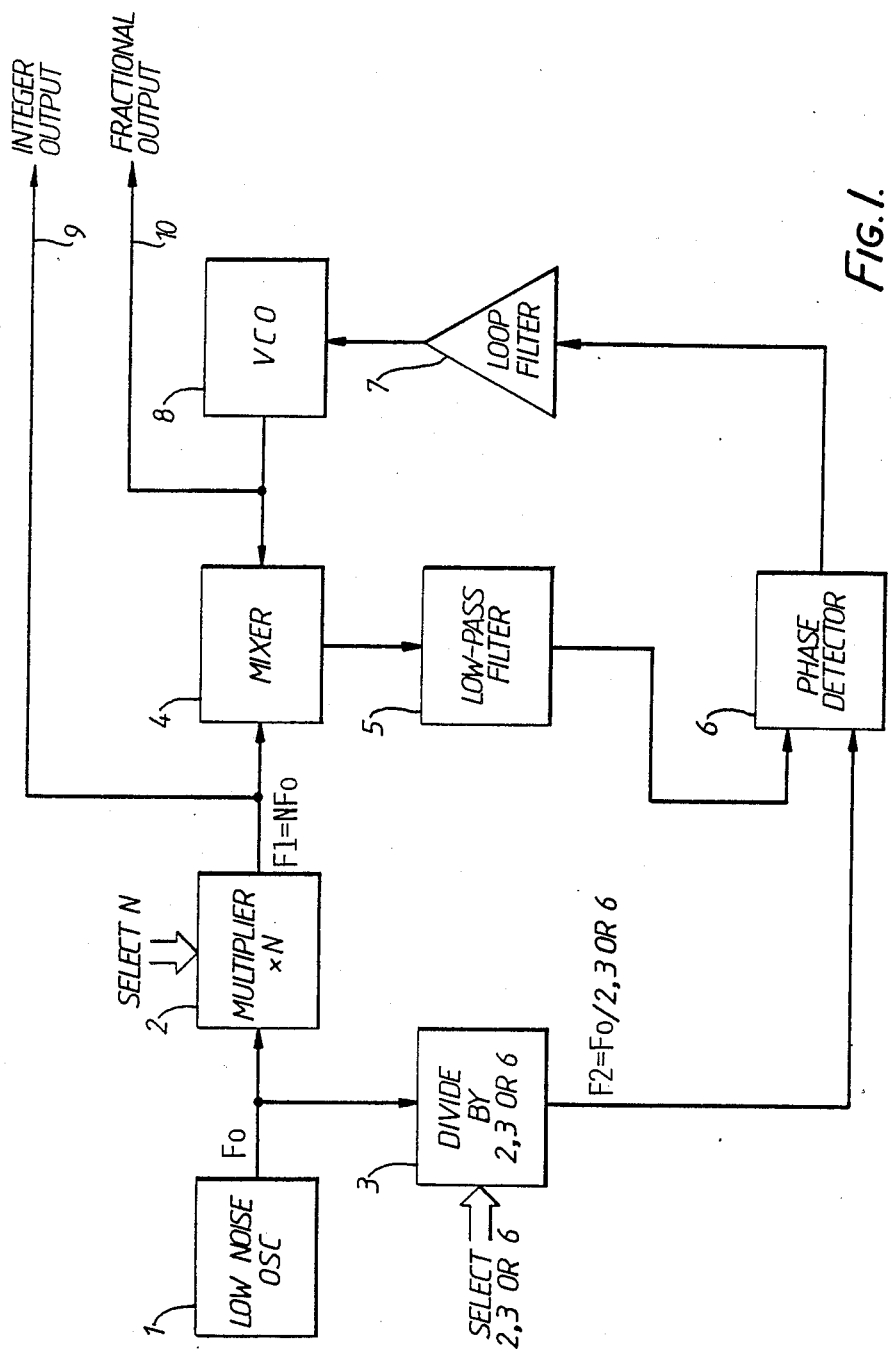
FIG. 1 shows a first frequency synthesizer according to the present invention.

Referring to FIG. 1 there is shown a frequency synthesizer including a low-noise oscillator 1 which is preferably a crystal oscillator arranged to produce a signal at a first frequency Fo. Such oscillators are commonly used for many varied purposes. An output is taken from the oscillator to a multiplier 2 and also to a divider 3. The resulting signals, respectively multiplied or divided are applied to a phase-locked loop which comprises a mixer 4, low pass filter 5, phase detector 6, a loop filter 7 and a voltage controlled oscillator (VCO) 8. An output is taken from the VCO 8 and also from the multiplier 2.

In use, the first frequency Fo, typically 100 MHz is generated by oscillator 1. This is applied to multiplier 2 to obtain a signal F1, where F1=NFo, N being a chosen integer, and from there to mixer 4. An output 9 may also be taken equal to NFo. The signal Fo is also applied to divider 3 which is selected to divide by two, three or six to produce a signal F2=Fo/2, Fo/3 or Fo/6. Signal F2 is then applied to one input of phase detector 6. The output of mixer 4 is applied via a low pass filter 5 to the other input of phase detector 6 which is used, through loop filter 7 to control the output of VCO 8. The output of VCO 8 is applied as the second input to mixer 4 and it will be seen that an equilibrium point is reached where in order to balance phases at detector 6 the input to this detector from the mixer must be equal to, or substantially equal to F2. Hence the VCO output will be given by F1±F2 and its value is taken as an output 10. Thus, a phase-locked loop is set in operation.

It will be easily appreciated that the following lock points are available from such a system, where N may be chosen by the user.

NFo+Fo/6

NFo+Fo/3, i.e. NFo+2Fo/6

NFo+Fo/2, i.e. NFo+3FO/6
NFo−Fo/3, i.e. (N−1) Fo+4Fo/6
NFo−Fo/6, i.e. (N−1) Fo+5Fo/6

Thus by varying N and also utilising the integer values available directly from the multiplier at output 9, all the frequencies are available in increments of Fo/6.

Figure 2:
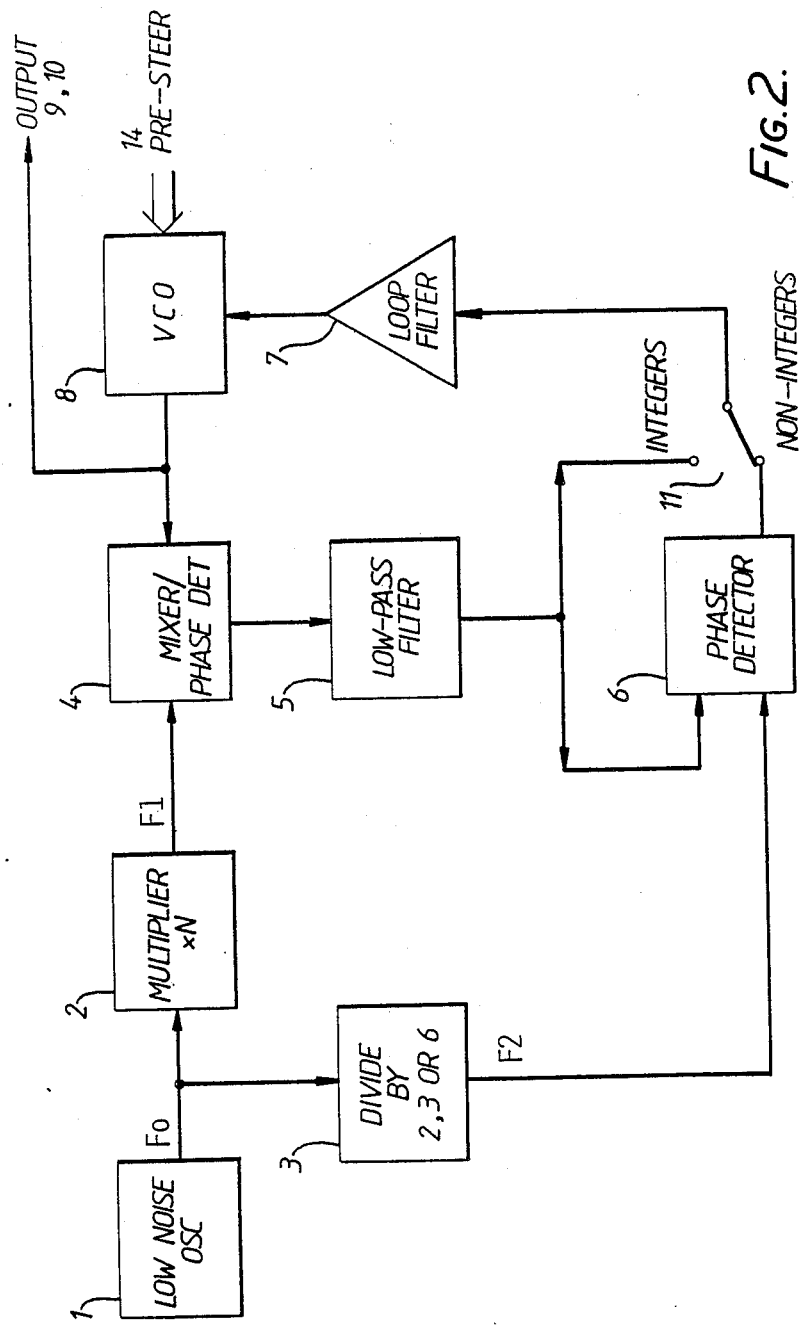
FIG. 2 shows a modification to the apparatus of FIG. 1.

However, the multiplier is liable to produce spurious outputs at harmonics other than the ones selected. The use of the phased-locked loop enables these spurious outputs to be filtered out but of course in the embodiment shown in FIG. 1 the integer output 9 from the multiplier is taken before the signal enters the phase-locked loop. FIG. 2 shows an alternative arrangement in which an integer output may be taken from a point within the phase locked loop. Similar components are given similar reference numerals in this figure and figure one. The apparatus is modified by the addition of a switch 11 and a further bypass line from the output of lowpass filter 5 to the switch. When the switch is in a first position shown by the wording "non-integers" then the system works exactly as in FIG. 1 and a phased-locked loop attempts to lock a signal which is a combination of F1 and F2. In a second position shown by the wording "integers" then the signal F2 generated by divider 3 is not applied to the phase locked loop and hence the signal generated by VCO 8 is equal to F1, i.e. NFo. In this case the mixer is used directly as the phase detector and the VCO is thus locked directly to the NFo.

By using the apparatus of FIG. 2 the frequency Fo can be raised by a factor of 6, giving an improvement of 15.56 dB in multiplied noise floor. The phase noise contribution can be minimized by using high signal levels and selecting high level mixers. The loop bandwidth should preferably be made as wide as possible commensurate with the need to eliminate Fo/6 from the VCO tuning line when this division ratio is in use. Outside the loop band width, the VCO noise dictates the performance.

The other major source of noise in the system is that from the divider 3 and multiplier 2. These two sources are not correlated and thus their noise powers will add at the mixer, regardless of whether the mixer 4 is adding or subtracting the frequencies. The divider operates at fixed frequency, and thus can be implemented as a very simple injection locked oscillator. Such circuits can typically achieve noise floors of −160 dBc quite easily and will not significantly contribute to the output noise unless a very low value of N is used in the multiplier.

Multipliers based on phase-locked loops using a sampling mixer are common and offer simplicity, coupled with a high level of rejection of unwanted harmonics due to the tracking bandpass filtering properties of a PLL. Unfortunately however the noise floor is often poorer in such devices than is expected due to the very wide noise bandwidth present at the input of the sampling mixer. A multiplier for use in the present invention may be arranged by direct filtering of the spectrum from a step-recovery diode, using a tunable bandpass filter. This requires a very high level of diode drive if sufficient energy is to be developed at the wanted harmonic in order to avoid noise floor problems. In addition, voltage-tunable band-pass filters are difficult and complex to design.

Figure 3:
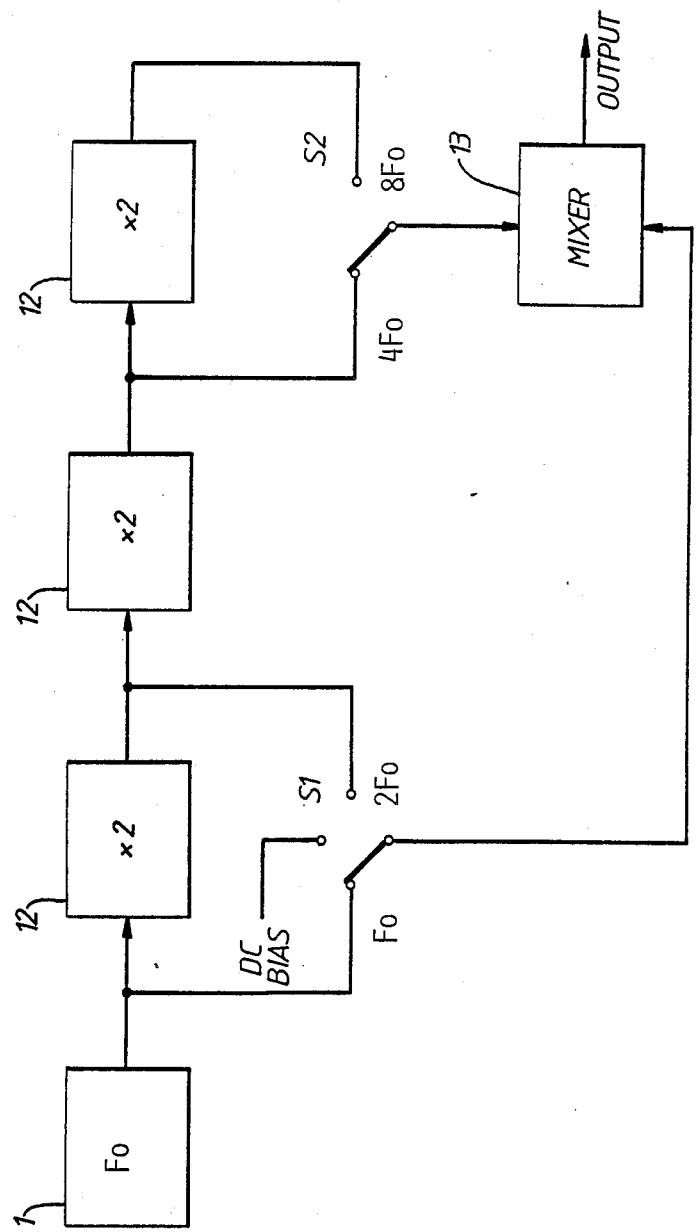
FIG. 3 shows a multiplier for use in the apparatus of FIG. 1 or FIG. 2.

FIG. 3 shows an alternative multiplier design which is simple to achieve and effective. The multiplier comprises a plurality of doublers 12, in this case 3, a mixer 13 and two switches S1 and S2. The switches are arranged to pass the outputs from selected ones of the doublers to the mixer. S1 is accordingly connected to one input of the mixer and also switchably to a) the input to the multiplier, shown as the output of oscillator 1, b) to the output of the first doubler and c) to a DC source, at which a DC bias may be applied. Switch S1 may therefore select a frequency of either Fo, 2Fo or DC (i.e. zero frequency). Similarly S2 has switchable inputs from the output of the second and third doublers and can thus select frequencies of either 4Fo or 8Fo. The signals from S1 and S2 are combined in mixer 13 and thus the following outputs are available from the mixer 13.

| INPUTS | | OUTPUTS |
| --- | --- | --- |
| DC | 4Fo | 4Fo |
| DC | 8Fo | 8Fo |
| Fo | 4Fo | 3Fo + 5Fo |
| Fo | 8Fo | 7Fo + 9Fo |
| 2Fo | 4Fo | 2Fo + 6Fo |
| 2Fo | 8Fo | 6Fo + 10Fo |

It is seen that all harmonic numbers up to 10 are available. Since neither doublers nor mixers tend to add appreciably to the noise floor of a signal, other than that expected from the frequency scaling then the multiplier can have a low noise floor, even with several doubler stages. The above table shows that frequencies 3Fo up to 10Fo are available, although most of the frequencies are available only in pairs. This is however unimportant since, when the multiplier is used in apparatus such as FIG. 1 or FIG. 2, the output of the phase-locked loop can be pre-steered (14 in FIG. 2) to select the response due to the wanted frequency and to reject the unwanted frequency.

By using a multiplier such as that shown in FIG. 3 in the apparatus of FIG. 2 a harmonic multiplier loop can be arranged with fifty or more possible output frquencies at a spacing equal to 1/6 of the reference frequency Fo. The noise floor of the output is six times lower than would be obtained if the same frequencies were derived from a simple multiplier loop based on a reference of Fo/6 having a similar noise floor to the reference in the present application at Fo.

If desired, a more complex synthesizer can be made using further transfer loops according to the present invention to obtain very fine frequency resolution. A good noise floor will still be obtained even after several such stages.

What I claim is:

1. A frequency synthesizer comprising
an oscillator for generating a signal having a predetermined frequency;
means for multiplying said predetermined frequency by an integer value;
means for dividing said predetermined frequency by an integer value;
a phase locked loop for combining the outputs of said multiplying means and said dividing means, said phase-locked loop comprising a phase detector, a voltage controlled oscillator and a mixer, said voltage controlled oscillator being steered to a frequency substantially equal to the multiplied frequency ± the divided frequency, the output of said phase lock loop providing the output of said frequency synthesizer; and phase detector switch means for selectively switching said phase detector into and out of said phase-locked loop.

2. A frequency synthesizer as claimed in claim 1 wherein said divider divides said predetermined frequency by a selected one of the integer values 2, 3 or 6.

3. A frequency synthesizer comprising
an oscillator for generating a signal having a predetermined frequency;
means for multiplying said predetermined frequency by an integer value, said means including
a series chain of multipliers an input coupled to said oscillator, each of the multipliers in said series chain multiplying a signal applied thereto by a fixed integer value; and
multiplier switch means coupled to the output of each of the multipliers in said series chain;
means for dividing said given frequency by an integer value; and
a phase locked loop for combining the outputs of said multiplying means and said dividing means, said phase lock loop including a mixer for receiving via said multiplier switch means the output from at least one of said series chain of multipliers.

4. A frequency synthesizer as claimed in claim 3 wherein each of the multipliers in said series chain of multipliers is a frequency doubler.

5. A frequency synthesizer as claimed in claim 3 wherein said multiplier switch means is connected to a DC source for coupling to said mixer.

6. A frequency synthesizer as claimed in claim 3 wherein said divider divides said predetermined frequency by a selected one of the integer values 2, 3 or 6.

7. A frequency synthesizer as claimed in claim 6 wherein said divider divides said predetermined frequency by a selected one of the integer values 2, 3 or 6.

8. A frequency synthesizer comprising
an oscillator for generating a signal having a predetermined frequency;
means for multiplying said predetermined frequency by an integer value to provide a multiplied signal;
a first output line coupled to the output of said multiplying means, said first output line providing as a first output of said frequency synthesizer said multiplied signal;
means for dividing said predetermined frequency by an integer value to provide a divided signal;
a phase locked loop for combining the outputs of said multiplying means and said dividing means to obtain a signal which is a combination of said multiplied and divided signals; and
a second output line coupled to the output of said phase locked loop, said second output line providing as a second output of said frequency synthesizer said combination of said multiplied and divided signals.

* * * * *